United States Patent [19]

Nuzzi et al.

[11] Patent Number: 4,981,725

[45] **Date of Patent: * Jan. 1, 1991**

[54] PROCESS AND COMPOSITION FOR SENSITIZING ARTICLES FOR METALLIZATION

[75] Inventors: Francis J. Nuzzi, Lynbrook; Edward J. Leech, Oyster Bay; Richard W. Charm, Glen Cove; Joseph Polichette, South Farmingdale, all of N.Y.

[73] Assignee: AMP-Akzo Corporation, Melville, N.Y.

[ * ] Notice: The portion of the term of this patent subsequent to May 31, 2005 has been disclaimed.

[21] Appl. No.: 879,773

[22] Filed: Feb. 21, 1978

Related U.S. Application Data

[63] Continuation of Ser. No. 632,700, Nov. 17, 1975, abandoned, which is a continuation of Ser. No. 407,555, Oct. 18, 1973, abandoned, which is a continuation-in-part of Ser. No. 270,861, Jul. 11, 1972, abandoned.

[51] Int. Cl.[5] .............................................. C23C 18/28

[52] U.S. Cl. .................................... 427/304; 427/305; 427/306

[58] Field of Search ........................ 427/304, 305, 306

[56] References Cited

U.S. PATENT DOCUMENTS

| | | | |
|---|---|---|---|
| 3,033,703 | 5/1962 | Schneble et al. | 427/306 |
| 3,524,754 | 8/1970 | Blytas | 427/306 |
| 3,793,037 | 2/1974 | Hacias | 428/457 |
| 3,925,578 | 12/1975 | Polichette et al. | 427/306 |
| 3,962,494 | 6/1976 | Nazzi | 427/306 |

*Primary Examiner*—Sam Silverberg
*Attorney, Agent, or Firm*—Morgan & Finnegan

[57] ABSTRACT

Non-metallic articles are sensitized for deposition of adherent metal from electroless metal solutions in contact therewith by treatment with a first medium including a compound or combination of compounds containing an element which in one of its states is catalytically active to electroless metal deposition thereby adsorbing on the surface in situ the elemnt(s) and/or compound(s); thereafter treating the surface with a second medium to decrease the solubility of the compound or combination of compounds and/or simultaneously removing the excess; and simultaneously or subsequently, if necessary, treating the surface with one or more agents to transfer said element(s) into a catalytically-active state.

10 Claims, No Drawings

PROCESS AND COMPOSITION FOR SENSITIZING ARTICLES FOR METALLIZATION

CROSS-REFERENCE TO RELATED APPLICATIONS

This application is a continuation of Ser. No. 632,700, filed Nov. 17, 1975, abandoned which is a continuation of Ser. No. 407,555, filed Oct. 18, 1973 (now abandoned), which, in turn, is a continuation-in-part of application Ser. No. 270,861, filed July 11, 1972 (now abandoned).

This invention relates to processes and compositions for sensitizing articles to the deposition of metals from solutions thereof. More particularly, it relates to improved means to provide adherent metal layers on non-metallic articles by treating such articles with a series of media which deposit catalytically active elements or precursors and contacting with electroless metal deposition solutions.

BACKGROUND OF THE INVENTION

Sensitizing non-metallic substrates to the deposition of electroless metal, e.g., Group IB and VIII metals, i.e., copper, cobalt, nickel, gold, silver and the like, is a key step in the production of decorative and industrially useful metallized objects, such as name plates, dials, printed circuits, and the like. This sensitization is conventionally carried out by treating the substrate either stepwise with precious metal, e.g., palladium or platinum, ions in solution followed by a solution of stannous tin or similar ions, or all in one step with a unitary colloidal suspension of precious metal or with a soluble complex of precious metal ion, stannous ion and an anion. This produces a sensitive surface which when immersed in a conventional electroless metal deposition bath causes metal to deposit on all of the sensitized areas thereof.

A number of proposals have been made to carry out such processes more economically and efficiently:

Chiecchi, U.S. Pat. No. 3,379,556 discloses immersion in a beta resorcylato chromic chloride solution to eliminate pretreatments such as sealing, sandblasting, etching and the like. This method still requires the use of a two step, stannous-palladium subsequent treatment, see, for example, Schneble, Jr. et al, U.S. Pat. No. 3,403,035 and U.S. Pat. No. 3,033,703. Moreover, the Werner-type chromium complexes are difficult to prepare, stabilize and use. In addition, the complex must be polymerized after application and before subsequent treatment steps.

Bernhardt et al, U.S. Pat. No. 3,547,784 disclose treating a non-metallic surface with stannous salt then with a silver salt and then electrolessly plating using processes and deposition baths for copper, nickel and silver found, for example, in Schneble, Jr. et al, U.S. Pat. Nos. 3,527,215 and 3,347,724. The Bernhardt et al process is conventional and the point of novelty resides in using a particular copolymer of vinyl chloride, which was not easy to metallize up until the time of the invention.

In a more recent development, there have been provided the so-called metal reduction sensitizers, which can employ base metal ions, followed by treatment with reducing solutions or radiant energy, e.g., heat, light and the like, to produce the sensitized surface.

The metal reduction sensitizing process consists of coating a surface, preferably one which has been activated in known ways either to render it permanently polarized and wettable, or microporous, with a reducible metal salt solution, e.g., $CuSO_4.5H_2O$, $NiSO_4.6H_2O$, and the like, then either draining, semi-drying or completely drying the so-treated surface. Sensitization is then completed by immersing the surface into a strongly reducing medium, e.g., a sodium borohydride solution, during which step the metal salts are reduced to elemental metal particles. This sensitized surface is then rinsed and electrolessly plated.

Because thorough rinsing of excess metal salts before transferring the workpiece to the reducing medium cannot be practiced, there are numberous difficulties when dealing with copper clad surfaces (on other portions of the article). Rinsing usually removes all of the metal salts. Moreover, there is also the problem of drag-over of excess metal salts into the reducing medium, and this shortens its life and also turns it black with atomic metal particles.

Obviously, if a means could be provided to rinse excess and unwanted metal salts from the surface before immersion in the reducing medium, the above noted problems would be avoided. In addition, control will be facilitated because rinsing will provide a positive indication that only those final catalytic elemental particles which remain are those which are adsorbed by the surface.

According to the present invention, improvements are provided in the wettability and adsorptivity of metal compound media which are used to render surfaces sensitive to electroless metal depositions. Because of their improved wettability and adsorptivity, such compositions can be formulated from base metals or combinations thereof with precious metals which have performance comparable to traditional expensive and somewhat unstable entirely precious metal-based sensitizers.

In comparison with the prior art techniques, the instant system provides the following distinct advantages:

(i) more complete rinsing between the first medium and any subsequent transformation agent can now be tolerated because of tremendously improved adsorption of any metallic compound or element in the first medium to the surface;

(ii) "take" or coverage in the electroless metal bath is wholly uniform and rapid; and (iii) in the case of activated substrates, metallization within the surface micropores is deep and complete enhancing bond strength.

DESCRIPTION OF THE INVENTION

According to the present invention, there is provided a process for sensitizing a non-metallic article for the deposition of adherent metal from an electroless metal deposition solution in contact therewith, said process comprising:

(i) treating the surface or selected areas of the surface of said article with a first medium comprising a compound or combination of compounds containing an element which in one of its states is catalytically active to electroless metal deposition or a combination of such elements thereby adsorbing on said surface in situ the said element or elements, or a compound or compounds containing said element or elements;

(ii) thereafter treating said article with a second medium to decrease the solubility of said compound or combination of compounds and/or simultaneously removing unadsorbed and excess components of said first medium from said surface; and (iii) simultaneously with or subsequently to step (ii) treating said surface with one or more agents, if necessary, to transfer said element or combination of elements into a state which is catalytically active for the deposition of electroless metal.

In a preferred feature of the invention, the agent or agents in step (iii) will be reducing agents, such as borohydrides, e.g., alkali metal borohydrides, amine boranes, e.g., dimethylamine boranes, hydrazine hydrate, and others. If difficulty metallizable substrates are used, e.g., acrylonitrile-butadienestyrene (ABS) polymers, in preferred embodiments step (iii) will be carried out in two separate stages and employing two separate reducing agents. In one such process, the first reducing agent will be a so-called secondary reducer, e.g., formaldehyde, a formaldehyde precursor, dimethyl hydantoin, a stabilized form thereof, and the like, and the second reducing agent will be a strong, primary reducer, e.g., a borohydride or an amine borane.

Among the features of this invention are processes wherein the element or combination of elements are base metal elements, preferably, copper, nickel, cobalt, iron or mixtures of any of the foregoing. Under certain circumstances, molybdenum, vanadium, and lead or mixtures thereof with any of the preferable elements cited above may also be used.

Preferably, the compound or combination of compounds in the first medium will be a wetting agent, i.e., it will seek and affix itself firmly to the surface being treated, e.g., by electrical attraction or other means. Preferably also, the first or second medium will comprise a wetting agent having a polarity which is opposite to the polarity of at least some of the surface sites of the article to be sensitized.

The present invention also contemplates the novel compositions having the required characteristics, e.g., media including compounds or combinations which are adsorbable, transformable, if necessary, and removable in excess by a second medium, as set forth above.

By way of further illustration, but with no intention of being bound by any hypothesis, in one embodiment, a first medium is formed when a copper compound or a nickel compound or mixture thereof is mixed with ammonia or amine to form a copper or nickel complex with ammonia or amine or a mixture thereof. Not only are ammonia or amines in their own rights powerful wetting agents, but so are the formed ion complexes. It appears that such ion complexes behave much like quaternary ammonium complexes, i.e., cationically. Such positively charged (polar) ion complexes are adsorbed by negative surface sites on the article to be sensitized.

In another embodiment a dichlorocuprate [I−] ion complex:

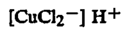

$[CuCl_2^-]\,H^+$ is formed by boiling copper chips with cupric chloride in a large excess of concentrated hydrochloric acid. As in the ammonia complex case, this compound is highly polar (polarity reversed however) and readily attaches to positive surface sites due to its relatively negative charge.

In a further embodiment a complex metal salt, e.g., ferrous sulfate ($FeSO_4$) is dissolved in ammonium hydroxide and this is put onto the surface to be sensitized.

In these embodiments, the rinse of the base with a second medium will decrease the solubility of the compound or combination of compounds. In the metal ammonium complex case, the basic metal ammonium compound is formed; in the cuprous ion complex case, loss of HCl in the rinse will lead to decreased solubility. In the soluble iron salt case, the second medium rinse causes decreased solubility.

All three concepts can use a variety of metallic compounds.

The media can comprise organic and inorganic solvents such as water, alcohols, e.g., methanol and the like, ketones, e.g., acetone, methyl ethyl ketone, etc., esters, e.g., ethyl acetate. Preferably, aqueous media are used.

Media based on organic systems can be employed, particularly on resin bearing systems such as epoxy. In one such system, cupric chloride is readily dissolved and complexed with dimethyl formamide (DMF). A resin bearing surface brought into contact with this solution quickly adsorbs metal complex. The surface is then rinsed with a second medium, e.g., water, which removes excess metal complex (and first medium) and then the surface is next treated with an agent to convert the metal to a catalytically active state, such as a solution of sodium borohydride or hydrazine hydrate dissolved in a suitable solvent, such as DMF.

The present invention can be used to sensitize a wide variety of non-metallic substrates, such as plastic, e.g., polyepoxides, phenolics, polystyrene, polyesters, nylons, polyacetals, polycarbonates, and the like, or glass, porcelain, cloth, paper, compressed wood, and the like. ABS resins are especially efficiently metallized with a "two-stage" treatment with reducing agents, as described above and exemplified hereinafter. The resinous substrates can be treated in known ways to activate the surfaces prior to sensitization—this gives the highest adhesion between subsequently deposited electroless metal and the resinous substrates.

One way to activate resinous bases is to render them permanently polar and wettable by treatment first with a pre-activating agent, e.g., dimethyl formamide, dimethyl sulfoxide, methyl ethyl ketone or mixture of toluene and water, etc., depending on the nature of the resin, then with an activator such as chromic acid-sulfuric acid, and then with a reducing agent, such as sodium bisulfite or hydroxylamine hydrochloride, the result of which is to produce a permanently polarized, wettable surface.

Such techniques are disclosed in greater detail, for example, in copending U.S. patent application Ser. No. 227,678, filed Feb. 18, 1972, the disclosure of which is incorporated herein by reference.

On the other hand, the surface of the resinous article can be partially degradable, or be provided with a surface layer having such properties, or contain degradable particles, such as rubber particles, and on treatment with suitable agents, such as chromic acid, or permanganate, is caused to become microporous and thus activated to adherent metal deposits.

Any conventional electroless metal deposition bath useful with conventionally precious metal sensitized surfaces can be used to deposit metal on the surfaces sensitized according to this invention. Generally, the deposition baths will contain an ion of the metal or metals whose deposition is desired, a complexing agent for the ion, a reducing agent for the ion and an agent to adjust the bath to an optimum, predetermined pH. Such baths are amply described in the patent and textbook literature. See, for example, the patents cited hereinabove.

DESCRIPTION OF THE PREFERRED EMBODIMENTS

The following examples illustrate the processes of this invention. They are not to be construed as limiting.

EXAMPLE 1

An epoxy-glass laminate is provided with holes at pre-selected locations. The surface is rendered permanently polarized and wettable by immersion in dimethyl formamide at 80° F. for 2–5 minutes, rinsing in water, immersing in a solution of 100 g./l. $CrO_3$, 250 ml./l. of concentrated sulfuric acid, balance water, for about 1 minute, immersing in a 5% solution of $NaHSO_3$ for about 2 minutes, rinsing thoroughly in cold water, then in hot (160° F.) water and air or oven-drying.

Then the laminate is reverse-masked with a conventional background resist and then sensitized by immersion in and adsorption of a copper compound from a first medium comprising

| | |
|---|---|
| $CuCl_2.2H_2O$ | 34 g./l. |
| Hydrochloric acid (37%) | 250 ml./l. |
| $NaH_2PO_2.2H_2O$ | 30 g./l. |
| Water (to make). | |

The so-treated laminate is next rinsed thoroughly with a second medium comprising cold water to decrease the solubility of said copper compound and to remove the excess.

The laminate is next immersed in a water or methanol solution of 1 gram/liter of sodium borohydride, causing the adsorbed copper compound to be reduced to catalytic sites of elemental copper.

The sensitized laminate is transferred to an electroless copper deposition bath of the formula:

| | |
|---|---|
| $CuSO_4.5H_2O$ | 30 g./l. |
| Rochelle salts | 150 g./l. |
| sodium cyanide | 30 mg./l. |
| formaldehyde (37%) | 15 ml./l. |
| wetting agent | 1 ml. |
| sodium hydroxide | to pH 13 |
| water (to make) | |

The conductor pattern is built up to the desired thickness, the mask is removed, and the finished printed circuit board is post cured for 30 minutes at about 320° F.

EXAMPLE 2

The procedure of Example 1 is repeated, substituting for the first medium, one comprising

| | |
|---|---|
| $Cu_2O$ | 15 g./l. |
| hydrochloric acid (37%) | 300 ml./l. |
| $NaH_2PO_4.H_2O$ | 30 g./l. |
| water (to make) | |

Substantially the same results are obtained.

EXAMPLE 3

The procedure of Example 1 is repeated, substituting for the first medium, one comprising:

| | |
|---|---|
| $CuSO_4.5H_2O$ | 25 g./l. |
| $NiSO_4.6H_2O$ | 25 g./l. |
| $NH_4OH$ (conc.) | 200 ml./l. |
| water (to make). | |

EXAMPLE 4

The procedure of Example 1 is repeated, substituting for the first medium, one comprising:

| | |
|---|---|
| $CuSO_4.5H_2O$ | 25 g./l. |
| $NiSO_4.5H_2O$ | 25 g./l. |
| $NH_4OH$ (conc.) | 200 ml./l. |
| hydroquinone | 2 g./l. |
| water (to make). | |

EXAMPLE 5

The procedure of Example 1 is repeated, substituting for the first medium, one comprising:

| | |
|---|---|
| $FeSO_4$ | 20 g./l. |
| $NH_4OH$ (conc.) | 200 ml./l. |
| water (to make). | |

EXAMPLES 6–12

The procedure of Example 1 is repeated, substituting, respectively, for the first medium, those comprising:

EXAMPLE 6

| | |
|---|---|
| $NiSO_4.6H_2O$ | 25 g./l. |
| $NH_4OH$ (conc.) | 200 ml./l. |
| water (to make). | |

EXAMPLE 7

| | |
|---|---|
| $CuSO_4.5H_2O$ | 25 g./l. |
| $NH_4OH$ (conc.) | 200 ml./l. |
| water (to make). | |

EXAMPLE 8

| | |
|---|---|
| $Co(C_2H_3O_2)_2.4H_2O$ | 25 g./l. |
| $NH_4OH$ (conc.) | 200 ml./l. |
| water (to make). | |

EXAMPLE 9

| | |
|---|---|
| CuCl | 10 g./l. |
| HCl (conc.) | 300 ml./l. |
| stannous chloride.$2H_2O$ | 30 g./l. |
| water (to make). | |

EXAMPLE 10

| | |
|---|---|
| $CuSO_4.5H_2O$ | 25 g./l. |
| triethanolamine | 40 g./l. |
| water (to make). | |

EXAMPLE 11

The procedure of Example 1 is repeated, but substituting for water as the second medium, 1 g. of sodium borohydride in 1000 ml. of water (pH 9.5–10.0).

EXAMPLE 12

A combination of metals comprises

| | |
|---|---|
| $CuSO_4.5H_2O$ | 10 g./l. |
| $NiSO_4.6H_2O$ | 10 g./l. |
| Benzyl trimethyl ammonium chloride | 10 g./l. |
| water (to make). | |

Substantially the same results are obtained.

EXAMPLE 13

This example illustrates the use of two separate reducers in the process of the present invention.

A disc of acrylonitrile-butadiene-styrene terpolymer (ABS) is immersed for 5 minutes in an alkaline cleaner at 65° C. Oakite 90 or Altrex are illustrative of suitable commercial materials and trisodium phosphate is also suitable. The cleaned ABS disc is rinsed for 5 minutes in water, then the surface is rendered permanently polarized and wettable by immersion for 1 minute in a solution of 250 ml./l. of methyl ethyl ketone in water, rinsing in water for 3–5 minutes, immersing in a solution of 370 g./l. of chromatic acid, 185 ml./l. of concentrated sulfuric acid, 0.5 g./l. of fluorinated hydrocarbon wetting agent (3M Company, FC-95), balance water, for about 5–8 minutes, rinsing in water for 1 minute, immersing in a solution of hydroxyl-amine hydrochloride, 20 g./l., hydrochloric acid (37%), 200 ml./l., balance water, for about 2 minutes and rinsing thoroughly in water for 5 minutes.

Then the activated disc is immersed in a solution comprising

| | |
|---|---|
| $CuSO_4.5H_2O$ | 25 g./l. |
| $NiSO_4.6H_2O$ | 25 g./l. |
| $NH_4OH$ (conc.) | 200 ml./l. |
| water (to make) | |

The so-treated disc is rinsed gently with water for 1 minute at pH (5–8) and about 15°–20° C., to decrease the solubility of the copper and nickel compounds and to remove the excess.

The disc is next immersed in a first reducer solution comprising

| | |
|---|---|
| formaldehyde (37%) | 100 ml./l. |
| water (to make) | |

for 1 minute, and the excess first solution is drained off for about 15–30 seconds.

Then the disc is immersed for 5 minutes in a second reducer solution comprising

| | |
|---|---|
| sodium borohydride | 1 g./l. |
| sodium hydroxide (50%) | 2 ml./l. |
| deionized water (to make) | |

(The second reducer is made by adding the $NaBH_4$ to water and mixing for 5 minutes, then adding the NaOH and mixing for 5 minutes longer).

The disc which now has catalytic surface sites of elemental copper and nickel is rinsed for 2 minutes with water (pH 5.0–8.0).

The sensitized disc is transferred to an electroless copper deposition bath of the formula:

| | |
|---|---|
| $CuSO_4.5H_2O$ | 30 g./l. |
| Rochelle salts | 150 g./l. |
| sodium cyanide | 30 mg./l. |
| formaldehyde (37%) | 15 ml./l. |
| wetting agent | 1 ml. |
| sodium hydroxide | to pH 13 |
| water (to make) | |

Electroless copper builds up to the desired thickness.

EXAMPLES 14–24

The procedure of Example 13 is repeated, substituting for the sensitizing medium described, the media used in Examples 1, 2, 4–10 and 12, respectively. ABS discs metallized with adherent electroless copper are obtained.

The invention is not limited to printed circuit boards or to the specific steps and methods described. Moreover, electroless metal baths for depositing any other conventional metal than copper, e.g., nickel, cobalt, silver, gold, and the like, can be used. Other anions, besides those exemplified, e.g., phosphates, bromides, fluorides, fluoborates, etc., can be used with the compound containing an element which is ultimately the catalytic agent.

We claim:

1. A process for sensitizing the surface of a non-metallic article for the deposition of an adherent metal from an electroless metal deposition solution in contact therewith, comprising the steps of:

(a) adsorbing on the surface or selected areas of the surface of said article, copper (I) ion compound by contacting said surface with a first medium comprising an aqueous solution containing a compound of said copper (I) ion compound and a compound of stannous tin;

(b) next rinsing said article with an aqueous second medium to decrease the solubility of the copper (I) ion compound adsorbed on said surface, while at the same time, removing from said surface with said second medium unadsorbed copper (I) ion compound carried over from said first medium; and (c) treating said article with at least one reducing agent to render said adsorbed copper (I) ion compound catalytically active for the electroless deposition of metal.

2. The process of claim 1, wherein said first medium is acidic.

3. The process of claim 1, wherein said reducing agent is a member of the group consisting of borohydrides, amine boranes and formaldehyde.

4. The process of claim 1, wherein the treatment with a reducing agent is carried out in two separate stages, employing two separate reducing agents.

5. The process of claim 4, wherein the reducing agent in the first separate stage is formaldehyde, and the reducing agent in the second separate stage is a borohydride.

6. A process for metallizing the surface of a non-metallic article by the deposition of an adherent metal from an electroless metal deposition solution in contact therewith, comprising the steps of:

(a) adsorbing on the surface or selected areas of the surface of said article, copper (I) ion compound by contacting said surface with a first medium comprising an aqueous solution containing a compound of said copper (I) ion compound and a compound of stannous tin;

(b) next rinsing said article with an aqueous second medium to decrease the solubility of the copper (I) ion compound adsorbed on said surface, while at the same time removing from said surface with said second medium unadsorbed copper (I) ion compound carried over from said first medium;

(c) treating said article with at least one reducing agent to render said adsorbed copper (I) ion compound catalytically active for the electroless deposition of metal; and (d) contacting said catalytically active article with an electroless metal deposition bath, to deposit metal thereon.

7. The process of claim 6, wherein said first medium is acidic.

8. The process of claim 6, wherein said reducing agent is a member of the group consisting of borohydrides, amine boranes and formaldehyde.

9. The process of claim 6, wherein the treatment with a reducing agent is carried out in two separate stages, employing two separate reducing agents.

10. The process of claim 9, wherein the reducing agent in the first separate stage is formaldehyde, and the reducing agent in the second separate stage is a borohydride.

* * * * *